(12) United States Patent
Chen et al.

(10) Patent No.: US 9,012,760 B2
(45) Date of Patent: Apr. 21, 2015

(54) THERMOELECTRIC DEVICE, ELECTRODE MATERIALS AND METHOD FOR FABRICATING THEREOF

(75) Inventors: Lidong Chen, Shanghai (CN); Monika Backhaus-Ricoult, Horseheads, NY (US); Lin He, Horseheads, NY (US); Xiaoya Li, Shangahi (CN); Yunshan Tang, Shanghai (CN); Xugui Xia, Shanghai (CN); Degang Zhao, Shanghai (CN)

(73) Assignee: Shanghai Institute of Ceramics, Chinese Academy of Sciences, Shanghai (CN)

( * ) Notice: Subject to any disclaimer, the term of this patent is extended or adjusted under 35 U.S.C. 154(b) by 467 days.

(21) Appl. No.: 13/257,521

(22) PCT Filed: Mar. 25, 2010

(86) PCT No.: PCT/US2010/028615
§ 371 (c)(1),
(2), (4) Date: Nov. 7, 2011

(87) PCT Pub. No.: WO2010/111462
PCT Pub. Date: Sep. 30, 2010

(65) Prior Publication Data
US 2012/0180842 A1 Jul. 19, 2012

(30) Foreign Application Priority Data

Mar. 26, 2009 (CN) .......................... 2009 1 0048222

(51) Int. Cl.
*H01L 35/16* (2006.01)
*H01L 35/34* (2006.01)
*H01L 35/08* (2006.01)

(52) U.S. Cl.
CPC ............... *H01L 35/34* (2013.01); *H01L 35/08* (2013.01)

(58) Field of Classification Search
CPC ............................. H01L 35/16; H01L 35/18
USPC .......................................... 136/238, 240, 201
See application file for complete search history.

(56) References Cited

U.S. PATENT DOCUMENTS

| 6,005,182 A | 12/1999 | Imanishi et al. ............... 136/201 |
| 6,127,619 A | 10/2000 | Xi et al. ......................... 136/203 |

(Continued)

FOREIGN PATENT DOCUMENTS

| CN | 101114692 A | 1/2008 |
| GB | 1204884 | 9/1970 |

(Continued)

OTHER PUBLICATIONS

CN 101114692A English Translation as provided by European Patent Office (http://worldwide.espacenet.com/publicationDetails/biblio?DB=EPODOC&II=0&ND=3&adjacent=true&locale=en_EP&FT=D&date=20080130&CC=CN&NR=101114692A&KC=A), translated on Jun. 2, 2014.*

(Continued)

*Primary Examiner* — Golam Mowla
(74) *Attorney, Agent, or Firm* — Harness, Dickey & Pierce, PLC

(57) ABSTRACT

A thermoelectric device, a method for fabricating a thermoelectric device and electrode materials applied to the thermoelectric device are provided according to the present invention. The present invention is characterized in arranging thermoelectric material power, interlayer materials and electrode materials in advance according to the structure of thermoelectric device; adopting one-step sintering method to make a process of forming bulked thermoelectric materials and a process of combining with electrodes on the devices to be completed simultaneously; and obtaining a π shape thermoelectric device finally. Electrode materials related to the present invention comprise binary or ternary alloys or composite materials, which comprise at least a first metal selected from Cu, Ag, Al or Au, and a second metal selected from Mo, W, Zr, Ta, Cr, Nb, V or Ti. The present invention simplifies fabricating procedures, reduces the cost and avoids adverse impacts due to exposing related elements to heat and pressure for a second time.

24 Claims, 4 Drawing Sheets

(56) References Cited

U.S. PATENT DOCUMENTS

| | | |
|---|---|---|
| 6,563,039 B2 | 5/2003 | Caillat et al. ............... 136/205 |
| 6,759,586 B2 | 7/2004 | Shutoh et al. ............... 136/205 |
| 7,321,157 B2 | 1/2008 | Chen et al. ................. 257/467 |
| 2002/0024154 A1 | 2/2002 | Hara et al. .................. 257/930 |
| 2006/0118159 A1* | 6/2006 | Tsuneoka et al. ............ 136/211 |
| 2007/0221264 A1 | 9/2007 | Shutoh et al. ............... 136/224 |
| 2008/0023057 A1 | 1/2008 | Nakajima et al. ............ 136/201 |

FOREIGN PATENT DOCUMENTS

| | | |
|---|---|---|
| JP | 199755 A | 7/1992 |
| JP | 11-195817 | 7/1997 |

OTHER PUBLICATIONS

DiSalvo, et al "Thermoelectric Cooling and Power Generation", Science 285, 703 (1999).

M. Orihashi, et al "Ni/n-PbTe and Ni/p-$Pb_{0.5}Sn_{0.5}$Te Joining by Plasma Activated Sintering", 17$^{th}$ Int'l Conf on Thermoelectrics (1998).

Hasezaki, et al "Thermoelectric Semiconductor and Electrode-Fabrication and Evaluation and SiGe/Electrode", 16$^{th}$ Int '1 Conference on Thermoelectrics (1997).

Nolas, et al "Effect of partial void filling on the lattice thermal conductivity of skutterudites", Physical Review B, vol. 58, No. 1, Jul. 1, 1998-1.

Rowe, et al "Evaluation of thermoelectric modules for power generation," J. of Power Fources 73 (1998) pp. 193-498.

Fan, et al "Joining of Mo to $CoSb_3$ by spark plasma sintering by inserting a Ti interlayer," Materials Letters 589 (2004) 3876-3878.

Rowe, et al "Optimisation of Thermoelectric Module Geometry for 'Waste Heat' Electric Power Generation", Journal of Power Sources, 38 (1992), pp. 253-259.

Saber, et al., "Test Results of Skutterudite Based Thermoelectric Unicouples", Energey Conversion & Management, 48 (2007), pp. 555-567.

Saber, et al., "Filled Skutterudite Antimonides: A New Class of Thermoelectric Materials", Science, Vo. 272, (1996), pp. 1325-1328.

Tang, et al., "High Temperature Thermoelectric Properties of n-type $Ba_3Ni_xCo_{4-x}Sb_{12}$ ", Journal Material Research, Vo. 15, No. 12, (2001), pp. 3343-3346.

* cited by examiner

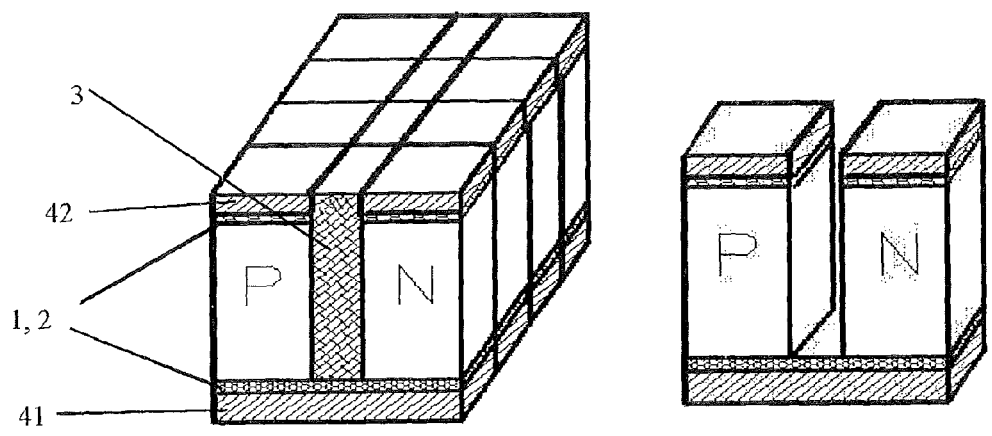
Figure 3a                    Figure 3b
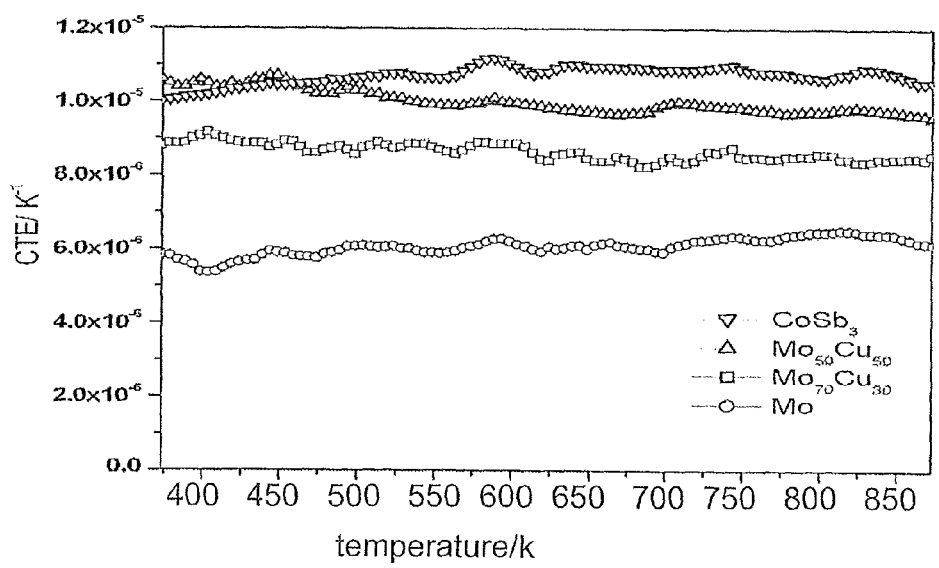
Figure 4

THERMOELECTRIC DEVICE, ELECTRODE MATERIALS AND METHOD FOR FABRICATING THEREOF

PRIORITY

This application claims priority to Chinese Patent Application number 200910048222.X, filed Mar. 26, 2009, titled "Thermoelectric Device, Electrode Materials and Method For Fabricating Thereof".

FIELD OF THE INVENTION

The present invention provides a thermoelectric device, a method for fabricating thermoelectric device, and electrode materials applied to the thermoelectric device, which falls into a technical field of thermoelectric conversion.

BACKGROUND

The electricity generation by thermoelectricity is a technique utilizing Seebeck effects in semiconductor materials for realizing direct conversion from heat to electricity, which is characterized in long lifespan, high reliability, safe environment, etc. It has wide applications and potential social and economic effects in areas of electricity generation by photoelectricity and thermoelectricity solar energy and electricity generation by industrial waste heat. Improving the figure of merit of thermoelectric materials is the key point to improve energy conversion efficiency of thermoelectric electricity generation. Therefore, studies in the field of thermoelectric conversion mainly focus on developing new thermoelectric materials with high performance. In another aspect, process of researching and developing new thermoelectric material devices is of equal importance for improving energy conversion efficiency of thermoelectric electricity generation.

Thermoelectric devices mainly comprise two types of thermoelectric semiconductor components, p type and n type. Since the voltage of a single thermoelectric device is very low, electrodes are usually used to have a variety of p type and n type thermoelectric components connected in series for electric conduction or connected in parallel for thermal conduction to construct a thermoelectric electricity generation module, thereby to acquire a higher voltage for usage.

Filled skutterudite is regarded as a new thermoelectric material in an intermediate temperature with high performance, which has a promising future of application. A technique for welding $Bi_2Te_3$ device is borrowed for welding electrode in a low temperature of a filled skutterudite device, where copper is chosen as the electrode material and the technique of tin soldering is adopted for welding. In respect of welding electrodes in a high temperature of filled skutterudite devices, according to existing reports, Cu, Mo, Ni—Cr, W, Ta, and their alloys, stainless steel (U.S. Pat. No. 6,005,182), Ag, Ag—Au, Ag—Cu, Fe (U.S. Pat. No. 6,759,586) and Nb (U.S. Pat. No. 6,563,039) are chosen as electrode materials, while copper brazing (U.S. Pat. No. 6,005,182, US2002/0024154, CN101114692, etc.), silver brazing (U.S. Pat. No. 6,759,586, US2008/0023057, etc.), sintering (US2006/0017170, U.S. Pat. No. 6,563,039, JP11195817, etc.) and the like are adopted as joining methods for electrodes and skutterudite materials.

Table 1 lists thermal expansion coefficients (CTEs), electrical conductivities and thermal conductivities of skutterudite and metallic materials. It can be seen that simple metals, except Ti, Fe, and Ni that have a CTE close to that of filled skutterudite, show large differences in CTE than filled skutterudite, while Ti, Fe and Ni, exhibit much lower electrical conductivity and thermal conductivity than Cu, Mo, etc. Stainless steel, which mainly composes of Fe, Cr, Ni, etc., has a CTE closest to that of the filled skutterudite material. In addition, it is observed that Mo has a smaller CTE than the filled skutterudite material while Cu has a larger CTE than filled skutterudite. When Mo and Cu are combined into alloy, the alloys may have CTE close to that of filled skutterudite material by adjusting relative proportion of the two, and may also maintain good electrical conductivity and thermal conductivity of Cu and Mo. W and Cu are quite the same.

Recently, a commonly adopted method for fabricating thermoelectric devices (for example, the method for fabricating thermoelectric devices recorded in a CN invention patent application NO. 200710044771.0) is mainly characterized in steps of: first fabricating (sintering) a bulk element of a thermoelectric device in a die, welding an electrode at a high temperature onto the bulk element, welding the side at a low temperature with a ceramic plate by solders, and then forming a π shape thermoelectric device by cutting or the like eventually. However, the existing method is not only complex, but also inevitably to expose thermoelectric materials (such as filled skutterudite) again to heat and pressure with a risk of degrading the performance of thermoelectric materials. Therefore, it is in urgent need of developing a new method for fabricating devices to simplify processing steps and avoid adverse impacts on thermoelectric materials.

TABLE 1

CTE, electrical conductivity and thermal conductivity of materials

| Materials | CTE ($\times 10^{-6}$ K$^{-1}$) (RT~875K) | electrical conductivity ($\times 10^6 \Omega^{-1}$ m$^{-1}$) | thermal conductivity (W/mK) |
|---|---|---|---|
| CoSb$_3$ based skutterudite | 10~11 | P: 0.062~0.073, N: 0.11~0.23 (RT~850K) | P: 2.1~2.6, N: 2.2~3.0 (RT~850K) |
| Mo | 5.6~6.2 | 18.1 | 138 |
| Cu | 18 | 59.6 | 334 |
| W | 4.5~4.6 (RT~100) | 18.9 | 138 |
| Ti | 8.4~8.6 (RT~100) | 1.9 | 21 |
| Ni | 13 (RT~100) | 16 | 82.8 |
| Fe | 12~13 (RT~100) | ~4 | 37 |
| Ag | 19 (RT~100) | 62.9 | 429 |
| Ta | 6.5 (RT~100) | 8.03 | 57.5 |
| Nb | 7.2~7.3 (RT~100) | 8 | 53.7 |
| stainless steel | 10~13 (RT~100) | 1.5-2.5 | 14-16 |
| Mo50Cu50 | 10.5~9.5 | 37.1 | 230~270 |
| Mo70Cu30 | 8.9~8.5 | 22.3 | 170~200 |
| WCu alloy | 9.0 | 54.3 | 220~230 |

SUMMARY

One purpose of the present invention is to provide a relatively simple method for fabricating a thermoelectric device, that is, to connect thermoelectric materials with electrodes by one-step sintering, which simplifies fabricating procedures, reduces the cost and avoids degradation of thermoelectric materials caused by a second sintering under high pressure.

According to one aspect of the present invention, a method for fabrication a thermoelectric device is provided, which comprises following steps: forming a first electrode having a top surface; depositing first interlayer materials on the top surface of the first electrode; forming a separating plate substantially vertical to the top surface of the first electrode to divide space over the first interlayer materials into a plurality of parts; depositing power of the first thermoelectric materials in some parts and on a first top surface of the first interlayer materials, and depositing power of the second thermoelectric materials in other parts and on a second top surface of the first interlayer materials, so as to form a stacked layer; sintering the powder to form at least one first thermoelectric element and at least one second thermoelectric element from the first thermoelectric materials and the second thermoelectric materials, and electrically connecting the first electrode with the first thermoelectric element and the second thermoelectric element to form an integral module; and removing the separating plate from the integral module to form a thermoelectric device.

In the above mentioned embodiment, the thermoelectric device is formed in a die.

According to another aspect of the present invention, the method mentioned above further comprises step of pre-treating at least one of the first electrode, the first interlayer materials and the separating plate, wherein the step of pre-treating comprises increasing surface roughness and removing metal oxides from exposed surface.

In the above mentioned embodiment, the first electrode comprises a plate or a foil; and the first electrode comprises binary or ternary alloys or composite materials, which comprise at least a first metal selected from Cu, Ag, Al or Au and a second metal selected from Mo, W, Zr, Ta, Cr, Nb, V or Ti.

Preferably, the first electrode comprises the metal alloys or composite materials selected from alloys with general formula $A_xB_{1-x}$, in which x (weight %) is 20≤x≤90, A comprises at least one material selected from Mo, W, Zr, Ta, Cr, Nb, V or Ti, and B comprises at least one material selected from Cu, Ag, Al or Au.

In the above mentioned embodiment, the step of depositing the first interlayer materials comprises depositing powder; and the depositing method comprises applying a process of plasma spraying, flame spraying, arc spraying or electroplating.

Preferably, the first interlayer materials comprise: a joint enhancement layer in contact with the first electrode; and a barrier layer stacked upon the joint enhancement layer. The separating plate comprises metals selected from Ni, Ag, Cu, Ti, Al or comprises alloys of two or more metals thereof, and the barrier layer comprises Ti or Al or alloys thereof.

Preferably, the first thermoelectric materials comprise at least one n type thermoelectric material or at least one component of n type composite thermoelectric material selected from n-$CoSb_3$ base, filled and/or doped n-$CoSb_3$ base, n-PbTe base, filled and/or doped n-PbTe base, n-$Zn_4Sb_3$ base, and filled and/or doped n-$Zn_4Sb_3$ base;

and the second thermoelectric materials comprise at least one p type thermoelectric material or at least one component of p type composite thermoelectric material selected from p-$CoSb_3$ base, filled and/or doped p-$CoSb_3$ base, p-PbTe base, filled and/or doped p-PbTe base, p-$Zn_4Sb_3$ base, and filled and/or doped p-$Zn_4Sb_3$ base.

Preferably, the separating plate comprises one or more of $ZrO_2$, $Al_2O_3$, AlN, $SiO_2$, glass, graphite, Ni, Cu, Fe and stainless steel.

In the above mentioned embodiment, the step of sintering comprises spark plasma sintering and may comprise sintering under a pressure of 20-100 MPa and a sintering temperature of 500-750° C.

According to one embodiment, the above mentioned method may comprise depositing the second interlayer materials on the respective top surfaces of the first thermoelectric materials and the second thermoelectric materials before sintering, and forming a second electrode on each of the second interlayer materials to form a stacked layer. In addition, according to one embodiment, the above mentioned method may further comprise step of pre-treating at least one of the second electrode and the second interlayer materials, wherein the step of pre-treating comprises at least one of increasing surface roughness and removing metal oxides from exposed surface.

Preferably, the second electrode comprises a plate or a foil. Preferably, the second electrode comprises binary or ternary alloys or composite materials, which comprise at least a first metal selected from Cu, Ag, Al or Au, and a second metal selected from Mo, W, Zr, Ta, Cr, Nb, V or Ti. More preferably, the second electrode comprises the metal alloys or composite materials selected from alloys with general formula $A_xB_{1-x}$, in which x (weight %) is 20≤x≤90, A comprises at least one material selected from Mo, W, Zr, Ta, Cr, Nb, V or Ti, and B comprises at least one material selected from Cu, Ag, Al or Au.

In the above mentioned embodiment, the step of depositing the second interlayer materials comprises depositing powder; and the depositing method comprises applying a process of plasma spraying, flame spraying, arc spraying or electroplating.

Preferably, the second interlayer materials comprise a barrier layer formed on the first thermoelectric element and the second thermoelectric element; and a joint enhancement layer in contact with the barrier layer.

Preferably, variation of thermal expansion coefficients of the thermoelectric elements and electrodes is less than 10%.

According to one embodiment, the first electrode comprises a plurality of first electrode elements; and the second electrode comprises a plurality of second electrode elements, wherein each electrode element of the first electrode is alternately connected with a pair of electrode elements of the second electrode via the thermoelectric elements such that a thermoelectric element of one doped type is electrically connected to an end part of the electrode element on the first electrode and to an end part of the electrode element on the second electrode, while another thermoelectric element of different doped type is electrically connected to another end part of the electrode element on the first electrode and to an end part of another electrode element on the second electrode.

According to another aspect of the present invention, a thermoelectric device is provided by the present invention, which is characterized in comprising: a first electrode; a first thermoelectric element and a second thermoelectric element in contact with the first electrode respectively; and an interlayer, which is formed between the first electrode and the first thermoelectric element or the second thermoelectric element, and is jointed therewith, wherein the first electrode comprises binary or ternary alloys, or composite materials, which comprise at least a first metal selected from Cu, Ag, Al or Au, and a second metal selected from Mo, W, Zr, Ta, Cr, Nb, V or Ti.

Preferably, the first electrode comprises the metal alloys or composite materials selected from alloys with general formula $A_xB_{1-x}$, in which x (weight %) is 20≤x≤90, A comprises at least one material selected from Mo, W, Zr, Ta, Cr, Nb, V or Ti, and B comprises at least one material selected from Cu, Ag, Al or Au.

Preferably, the first thermoelectric materials comprise at least one n type thermoelectric material or at least one component of n type composite thermoelectric material selected from n-$CoSb_3$ base, filled and/or doped n-$CoSb_3$ base, n-PbTe base, filled and/or doped n-PbTe base, n-$Zn_4Sb_3$ base, and filled and/or doped n-$Zn_4Sb_3$ base;

and the second thermoelectric materials comprise at least one p type thermoelectric material or at least one component of p type composite thermoelectric material selected from p-CoSb$_3$ base, filled and/or doped p-CoSb$_3$ base, p-PbTe base, filled and/or doped p-PbTe base, p-Zn$_4$Sb$_3$ base, and filled and/or doped p-Zn$_4$Sb$_3$ base.

According to one embodiment, the thermoelectric device may further comprise: a second interlayer formed on the respective top surfaces of the first thermoelectric element and the second thermoelectric element; and a second electrode formed upon each interlayer.

Preferably, the second electrode comprises binary or ternary alloys or composite materials, which comprise at least a first metal selected from Cu, Ag, Al or Au, and a second metal selected from Mo, W, Zr, Ta, Cr, Nb, V or Ti.

More preferably, the second electrode comprises the metal alloys or composite materials selected from alloys with general formula A$_x$B$_{1-x}$, in which x (weight %) is 20≤x≤90, A comprises at least one material selected from Mo, W, Zr, Ta, Cr, Nb, V or Ti, and B comprises at least one material selected from Cu, Ag, Al or Au.

The present invention embraces advantages of obtaining π shape elements with one-step sintering, simplifying complex procedures for obtaining π shape elements in prior art, and preventing adverse impacts on performance of filled thermoelectric materials caused by exposing filled thermoelectric materials to heat and pressure for a second time in prior art.

It should be understood that the forgoing general description and following detailed description of the present invention are exemplary and explanatory, and are intended to provide further interpretations for the present invention according to the claims.

BRIEF DESCRIPTION OF THE DRAWINGS

The drawings, provided for further understanding of the present invention, are included and embodied as part of the present application, which illustrate embodiments of the present invention and interpret principles of the present invention in company with the specification. In the figures:

FIG. 3a illustrates π shape devices before removal of separating plates.

FIG. 3b illustrates a single π shape device after removal of the separating plate.

FIG. 4 illustrates a temperature dependency of the thermal expansion coefficient of electrode and CoSb$_3$ thermoelectric materials.

FIGS. 5a-5c illustrate Scanning Electron Microscopy (SEM) micrographs of the joints of CoSb$_3$/Ti/electrode before thermal aging, in which FIG. 5a shows the joints of CoSb$_3$/Ti/Mo, FIG. 5b shows the joints of CoSb$_3$/Ti/Mo$_{70}$Cu$_{30}$, FIG. 5c shows the joints of CoSb$_3$/Ti/Mo$_{50}$Cu$_{50}$.

FIGS. 6a-6b illustrate Scanning Electron Microscopy (SEM) micrographs of the joints of CoSb$_3$/Ti/Mo—Cu after a thermal test, wherein FIG. 6a shows the joints of CoSb$_3$/Ti/Mo$_{70}$Cu$_{30}$, FIG. 6b shows the joints of CoSb$_3$/Ti/Mo$_{50}$Cu$_{50}$.

DETAILED DESCRIPTION

Figures 1A, 1B, 1C, 1D:
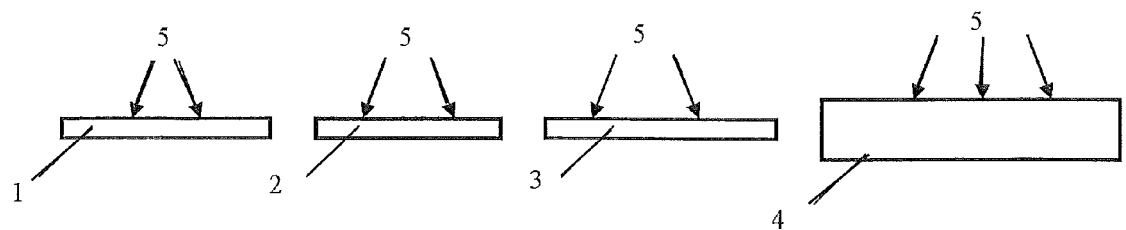
FIGS. 1a-1d illustrate a barrier layer, a joint enhancement layer, a separating plate and an electrode, respectively, under pretreatment.

A new method for fabricating filled skutterudite thermoelectric devices for electricity generation with high efficiency and reliability is raised by the inventor to overcome various drawbacks in prior art. The major characteristics of method lie in steps of: placing a hot end electrode, a joint enhancement layer and a barrier layer into a die sequentially after pretreatment; filling p/n filled skutterudite powder; then placing a barrier layer, a joint enhancement layer and a cold end electrode sequentially; performing a spark plasma sintering to obtain a π shape element directly; soldering a plurality of π shape elements on a ceramic plate to form a filled skutterudite device.

Detailed description will be made to the present invention in conjunction with the accompanying drawings. It shall be noted that skutterudite is taken as an exemplary thermoelectric material in the following description of all embodiments. However, it should be understood by those skilled in the art that skutterudite in the following embodiments may be replaced by other known thermoelectric materials for realizing the present invention. Therefore, the present invention shall not be limited to any specific materials in the following embodiments.

Embodiment 1

First, a process of pretreatment 5 is performed.

As shown in FIGS. 1a-1d, sand spraying or ultrasonic cleaning (e.g. in ethanol) is performed on a barrier layer 1, a joint enhancement layer 2, a separating plate 3 and an electrode 4 to remove surface oxides or other impurities and create roughness on the surface. It is preferably performed with the high purity quartz sand under spray pressure of 0.1-0.5 MPa for 30 sec to 3 min, and the time for ultrasonic cleaning may be 5-15 min.

Figure 2:
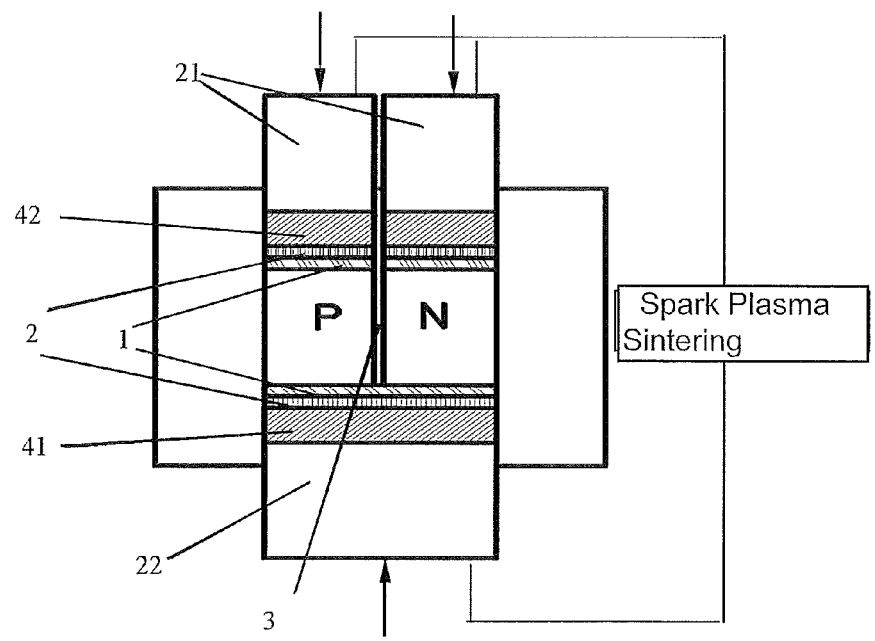
FIG. 2 illustrates a schematic of a π shape device formed by spark plasma sintering according to an embodiment of the present invention.

Next, a process of filling and sintering is performed, referring to FIG. 2.

A hot end electrode 41, a joint enhancement layer 2 and a barrier layer 1 are configured in a die sequentially. The joint enhancement layer 2 and the barrier layer 1 may be placed in a simple manner, or may adopt techniques such as plasma spraying, flame spraying, arc spraying or electroplating. Of course, there is no specific limitation on the specific placement in the present invention, any placements known by those skilled in the art may be adopted to realize the present invention. Next, a separating plate 3 is vertically inserted in an upper side of the hot end electrode 41, which divides the die into two parts, in order to place p type thermoelectric material and n type thermoelectric material into either part separately, for example, filling p/n filled skutterudite powder according to a preferred embodiment. Then, a barrier layer 1, a joint enhancement layer 2 and a cold end electrode 42 are placed sequentially on the thermoelectric material. Of course, those skilled in the art may divide the inner space into more parts by reasonable solutions. The stacked structure is pre-pressed via an upper pressing head 21 and a lower pressing head 22. Next, the die is sintered. In the embodiment illustrated in FIG. 2, for example, the die is placed in a spark plasma sintering equipment for sintering, such that the formation of a bulk of the p/n filled skutterudite powder and its combination with the electrode are completed at the same time.

According to one aspect of the present invention, the selection for electrode materials and their combination with thermoelectric component are crucial in fabricating thermoelectric device. Recently, Bi$_2$Te$_3$ based devices at a low temperature are already commercialized, commonly having copper as electrodes and adopting traditional solder technique for welding. It is required to take at least following factors into consideration for the selection of the electrode materials. The electrode materials should have (1) CTE match with the thermoelectric materials in order to reduce the thermal stress as much as possible during the process of fabricating and using the device and to avoid failure in welding the electrode or invalidity during the process of using the device due to excessive thermal stress; (2) good electrical conductivities and thermal conductivities in order to reduce disbennifit impacts on device performance such as energy conversion efficiency, due to the electric resistance and thermal resistance incurred by electrodes; (3) good thermal durability; and (4) relatively easy fabricating and processing technology for joining on the thermoelectric materials.

In the above embodiments, for both hot end electrodes and cold end electrodes, it is preferred to select metallic materials that have CTE match with the selected thermoelectric materials and have good electrical and thermal conductivities. For example, metallic materials (such as Mo, W, Zr, Ta, Cr, Nb, V, Ti, etc.) which have CTE lower than that of filled skutterudites, are combined with metallic materials (such as Cu, Ag, Al, Au, etc.) which have CTE higher than that of filled skutterudites and have good electrical and thermal conductivities, to form binary or ternary materials. The combination method can be melting or rolling after sintering. The preferred thickness of the electrodes might be 0.5-1.5 mm. And more preferably, the hot end electrode and the cold end electrode may be selected from alloys with general formula $A_xB_{1-x}$, in which x (weight %) is 20≤x≤90, A comprises at least one material selected from Mo, W, Zr, Ta, Cr, Nb, V or Ti, and B comprises at least one material selected from Cu, Ag, Al or Au.

Figure 5A:
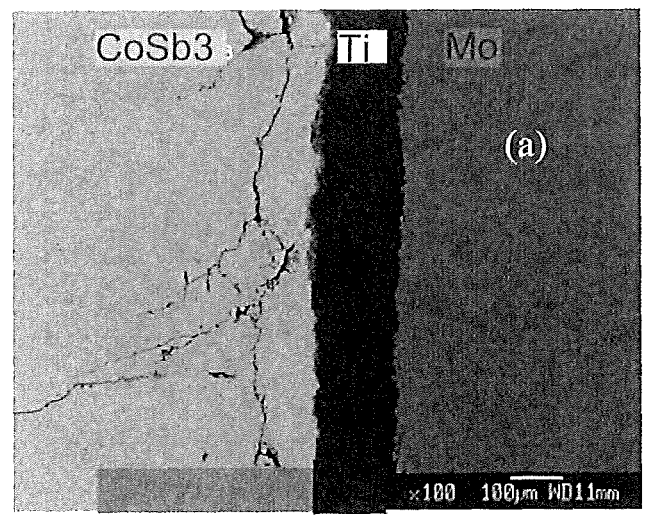
Figure 5B:
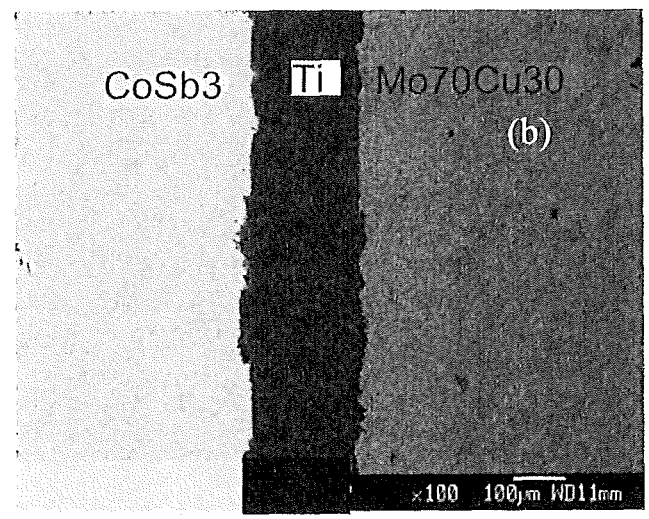
Figure 5C:
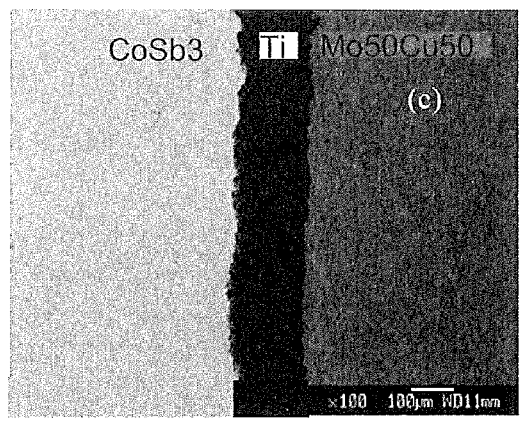
Figure 6A:
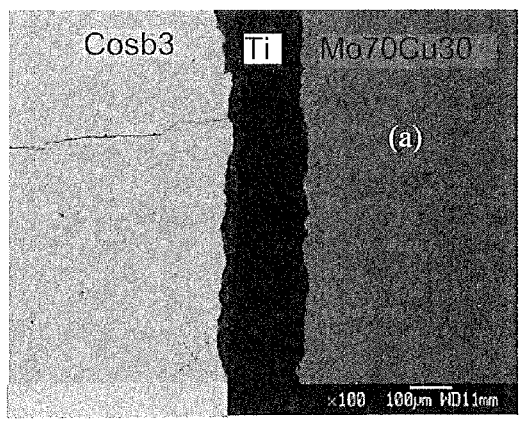
Figure 6B:
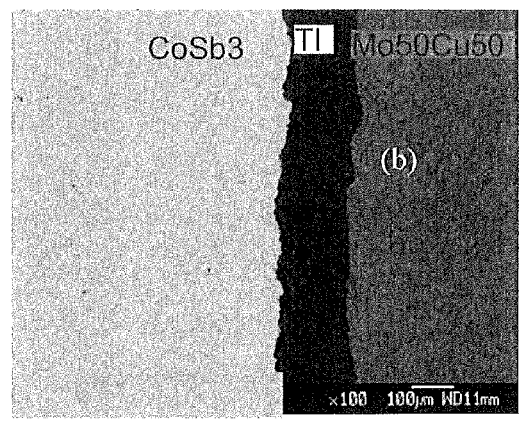

$Mo_xCu_y$ alloy is a preferred electrode material as for $CoSb_3$-based thermoelectric material. As shown in FIG. 4, $Mo_{50}Cu_{50}$ has the lowest CTE mismatch with the $CoSb_3$-based thermoelectric material. Moreover, as shown in FIGS. 5a-5c, $Mo_{50}Cu_{50}$ and $Mo_{70}Cu_{30}$ can remain crack-free before sintered. After thermal aging at 500° C. for 500 hours, $Mo_{50}Cu_{50}$ remains crack-free while $Mo_{70}Cu_{30}$ develops cracks, as shown in FIGS. 6a-6b. Therefore, $Mo_{50}Cu_{50}$ is the most preferred electrode material as for $CoSb_3$-based thermoelectric material.

In addition, the separating plate 4 mentioned above is preferred to be selected one or several materials of $ZrO_2$, $Al_2O_3$, AlN, $SiO_2$, glass, graphite, Ni, Cu, Fe and stainless steel. The preferred thickness of the separating plate 4 might be 0.2-1.0 mm.

At least one n type thermoelectric material or at least one component of n type composite thermoelectric material may be selected from n-$CoSb_3$ base, filled and/or doped n-$CoSb_3$ base, n-PbTe base, filled and/or doped n-PbTe base, n-$Zn_4Sb_3$ base, and filled and/or doped n-$Zn_4Sb_3$ base, as exemplary for above mentioned n type thermoelectric materials.

At least one n type thermoelectric material or at least one component of p type composite thermoelectric material may be selected from p-$CoSb_3$ base, filled and/or doped p-$CoSb_3$ base, p-PbTe base, filled and/or doped p-PbTe base, p-$Zn_4Sb_3$ base, and filled and/or doped p-$Zn_4Sb_3$ base, as exemplary for above mentioned p type thermoelectric materials.

The minimization of the CTE mismatch between thermoelectric materials and electrode materials on the hot end, and the improvement of thermal durability of thermoelectric devices are major considerations for these preferred thermoelectric materials. Therefore, alloys are more suitable for hot end electrode materials compared to single metal.

Usually, the barrier layer 1 is chiefly configured to prevent possible diffusion of performance degradation on materials. The joint enhancement layer 2 is chiefly configured to enhance combination between materials. Consequently, although the two layers are deposited simultaneously in the above mentioned embodiments, either the barrier layer or the joint enhancement layer may be deposited as required to serve as an interlayer between the electrode and the thermoelectric material. In addition, joint enhancement layer 2 and the barrier layer 1 are preferred to be a Ag alloy solder, a copper alloy solder, or a Ag—Cu alloy solder plus Ti foil. Preferably, the thickness of the solder is in the range of 80-150 um and the thickness of Ti foil is 30-100 um. The joint enhancement layer 2 and the barrier layer 1 can also be Ti powder with purity no less than 98% and particle size 100-500 um. It is not necessary to pre-treat the Ti powder. Ti powder can be placed directly on top of the electrode with thickness ranging from 20 to 100 um. Particularly, a single interlayer may be provided to function as joint enhancement layer/barrier layer. In this situation, the single interlayer may be Ti powder, Al powder, or mixed power or alloy power of the two.

Preferably, the above mentioned pre-pressure is 2-30 MPa, and sintering parameters are vacuum=0.5-20 Pa, sintering pressure=20-100 MPa, heating rate=20-300° C./min, sintering temperature=500-750° C., hold time=2-20 minutes.

The above mentioned cold end electrode is preferably to be metallic materials or metal composites materials which have good CTE match with filled skutterudite and have good electrical and thermal conductivities, and also have good wetting with tin solder for fabricating tin soldering layer.

Again, the separating plate is removed. The separating plate 3 may be removed after sintering.

Thus, π shape thermoelectric devices are obtained after removal of the separating plate preferably by line cutting. FIGS. 3a and 3b illustrate π shape thermoelectric devices before and after removal of the separating plate, respectively. Of course, it can be understood that any suitable cutting methods may be adopted without departing from principles of the present invention.

According to one preferred embodiment of the present invention, the sintering die may be designed to sinter several π shape thermoelectric devices at the same time, particularly for improvement of efficiency, as illustrated in FIG. 3a. That is, at the step of inserting the separating plate 3, whole space of the die is divided into several parts, e.g. eight parts in the embodiment as illustrated in FIG. 3a. Of the several parts, p type thermoelectric materials are deposited within some parts while p type thermoelectric materials are deposited within other parts respectively. In such situation, it can be understood by those skilled in the art that a plurality of π shape thermoelectric devices can be simultaneously fabricated by one-step sintering through similar procedures.

Finally, a plurality of π shape thermoelectric devices are welded on a copper coated ceramic plate.

Specifically, a tin soldering layer is fabricated onto the cold end electrode on π shape thermoelectric device before welding, and then the π shape thermoelectric device is welded on a copper coated ceramic plate covered with tin.

Embodiment 2

As compared to the embodiment 1, the main distinction of embodiment 2 lies in that the embodiment 2 omits steps of providing a separating plate and a joint enhancement layer onto the cold end of the thermoelectric material, and providing a cold end electrode. Consequently, the description of same steps as those in the embodiment 1 are omitted below.

According to the embodiment 2, during the filling process in the embodiment 1, the separating plate 1, the joint enhancement layer 2 and the cold end electrode 42 may not be inserted again after filling up p/n filled skutterudite powder, rather, the upper pressing head 21 is placed therein directly. And a π shape element without cold end electrode is obtained after sintering.

In respect of the π shape element without sintering cold end electrode, a separating plate, a joint enhancement layer and a tin soldering layer may be fabricated on the cold end before welding the π shape element on a copper coated ceramic plate. And then, thermoelectric devices are obtained when welded with the copper coated ceramic plate. Preferably, the barrier layer is a Mo metal layer with the thickness in the range of 10-80 um, which is fabricated by plasma spray coating. The enhancement layer is a Ni metal layer with the thickness in the range of 10-100 um, which is fabricated by plasma spraying, flame spraying or electroplating. The tin soldering layer has the thickness in the range of 100-500 um, which may be fabricated by tin dipping or electroplating.

In summary, one obvious character of the embodiments of the present invention is that process of forming bulked thermoelectric materials and process of combining with hot end electrodes on the devices are completed simultaneously, to thereby avoid adverse impact on exposing thermoelectric materials due to heat and pressure for a second time caused by welding hot end electrode of the thermoelectric device in the prior art.

It can be readily appreciated by those skilled in the art that any variations and modifications of the foregoing exemplary embodiments of the present invention can be made without departing from the spirit and scope of the present invention. Therefore, these variations and modifications of the present invention shall be construed as fall within the scope of appended claims and equivalent technical solutions thereof.

What is claimed is:

1. A method for fabricating a thermoelectric device comprising:
    forming a first electrode having a top surface;
    depositing first interlayer materials on the top surface of the first electrode;
    forming a separating plate substantially vertical to the top surface of the first electrode to divide space over the first interlayer materials into a plurality of parts; whrein the separating plate comprises metals selected from Ni, Ag, Cu, Ti, Al, or comprises alloys of two or more metals thereof;
    depositing powder of the first thermoelectric materials in some parts and on a first top surface of the first interlayer materials, and depositing powder of the second thermoelectric materials in other parts and on a second top surface of the first interlayer materials, so as to form a stacked layer;
    sintering the powder to form at least one first thermoelectric element and at least one second thermoelectric element from the first thermoelectric materials and the second thermoelectric materials, and electrically connecting the first electrode with the first thermoelectric element and the second thermoelectric element, to form an integral module; and
    removing the separating plate from the integral module to form a thermoelectric device.

2. The method of claim 1, wherein the thermoelectric device is formed in a die.

3. The method of claim 1, wherein further comprising a step of pre-treating at least one of the first electrode, the first interlayer materials and the separating plate, wherein the step of pre-treating comprises increasing surface roughness and removing metal oxides from exposed surfaces.

4. The method of claim 1, wherein the first electrode comprises a plate or a foil.

5. The method of claim 1, wherein the first electrode comprises binary or ternary alloys or composite materials, which comprise at least a first metal selected from Cu, Ag, Al or Au and a second metal selected from Mo, W, Zr, Ta, Cr, Nb, V or Ti.

6. The method of claim 1, wherein the metal alloys or composite materials of the first electrode are selected from alloys with general formula $A_xB_{1-x}$, in which x (weight %) is $20 \leq x \leq 90$, A comprises at least one material selected from Mo, W, Zr, Ta, Cr, Nb, V or Ti, and B comprises at least one material selected from Cu, Ag, Al or Au.

7. The method of claim 1, wherein the step of depositing the first interlayer materials comprises depositing powder.

8. The method of claim 1, wherein the step of depositing the first interlayer materials comprises applying a process of plasma spraying, flame spraying, arc spraying or electroplating.

9. The method of claim 1, wherein the first interlayer materials comprise: a joint enhancement layer in contact with the first electrode; and a barrier layer stacked on the joint enhancement layer.

10. The method of claim 9, wherein the barrier layer comprises Ti or Ai alloys thereof.

11. The method of claim 1, wherein,
    the first thermoelectric materials comprise at least one n type thermoelectric material or at least one component of n type composite thermoelectric material selected from $n$-$CoSb_3$ base, filled and/or doped $n$-$CoSb_3$ base, $n$-$PbTe$ base, filled and/or doped $n$-$PbTe$ base, $n$-$Zn_4Sb_3$ base, and filled and/or doped $n$-$Zn_4Sb_3$ base; and
    the second thermoelectric materials comprise at least one p type thermoelectric material or at least one component of p type composite thermoelectric material selected from $p$-$CoSb_3$ base, filled and/or doped $p$-$CoSb_3$ base, $p$-$PbTe$ base, filled and/or doped $p$-$PbTe$ base, $p$-$Zn_4Sb_3$ base, and filled and/or doped $p$-$Zn_4Sb_3$ base.

12. The method of claim 1, wherein the separating plate comprises one or more of $ZrO_2$, $Al_2O_3$, AlN, $SiO_2$, glass, graphite, Ni, Cu, Fe and stainless steel.

13. The method of claim 1, wherein the step of sintering comprises spark plasma sintering.

14. The method of claim 1, wherein the step of sintering comprises sintering under a pressure of 20-100 MPa and a sintering temperature of 500-750.degree. C.

15. The method of claim 1, further comprising depositing the second interlayer materials on the respective top surfaces of the first thermoelectric materials and the second thermoelectric materials before sintering, and forming a second electrode on each of the second interlayer materials to form a stacked layer.

16. The method of claim 15, further comprising step of pre-treating at least one of the second electrode and the second interlayer materials, wherein the step of pre-treating comprises at least one of increasing surface roughness and removing metal oxides from exposed surfaces.

17. The method of claim 15, wherein the second electrode comprises a plate or a foil.

18. The method of claim 15, wherein the second electrode comprises binary or ternary alloys or composite materials, which comprise at least a first metal selected from Cu, Ag, Al or Au, and a second metal selected from Mo, W, Zr, Ta, Cr, Nb, V or Ti.

19. The method of claim 15, wherein the metal alloys or composite materials of the second electrode are selected from alloys with general formula $A_xB_{1-x}$, in which x (weight %) is $20 \leq x \leq 90$, A comprises at least one material selected from Mo, W, Zr, Ta, Cr, Nb, V or Ti, and B comprises at least one material selected from Cu, Ag, Al or Au.

20. The method of claim 15, wherein depositing the second interlayer materials comprises depositing powder.

21. The method of claim 15, wherein the step of depositing the second interlayer materials comprises applying a process of plasma spraying, flame spraying, arc spraying or electroplating.

22. The method of claim 15, wherein the second interlayer materials comprise:
  a barrier layer formed on the first thermoelectric element and the second thermoelectric element; and
  a joint enhancement layer in contact with the barrier layer.

23. The method of claim 15, wherein a variation of thermal expansion coefficients of the thermoelectric elements and electrodes is less than 10%.

24. The method of claim 15, wherein
  the first electrode comprises a plurality of first electrode elements; and
  the second electrode comprises a plurality of second electrode elements,
  wherein each electrode element of the first electrode is alternately connected with a pair of electrode elements of the second electrode via the thermoelectric elements such that a thermoelectric element of one doped type is electrically connected to an end part of the electrode element on the first electrode and to an end part of the electrode element on the second electrode, while another thermoelectric element of different doped type is electrically connected to another end part of the electrode element on the first electrode and to an end part of another electrode element on the second electrode.

\* \* \* \* \*